(12) United States Patent
Goto et al.

(10) Patent No.: US 7,913,643 B2
(45) Date of Patent: Mar. 29, 2011

(54) FILM FORMING APPARATUS AND FILM FORMING METHOD

(75) Inventors: Kenji Goto, Kohtoh-ku (JP); Takuya Kawashima, Kohtoh-ku (JP); Nobuo Tanabe, Kohtoh-ku (JP); Yasuo Suzuki, Kohtoh-ku (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 12/046,963

(22) Filed: Mar. 12, 2008

(65) Prior Publication Data

US 2008/0254223 A1    Oct. 16, 2008

Related U.S. Application Data

(63) Continuation of application No. PCT/JP2006/314072, filed on Jul. 14, 2006.

(30) Foreign Application Priority Data

Sep. 13, 2005   (JP) .................................. 2005-265301

(51) Int. Cl.
  *B05B 7/16*     (2006.01)
  *B05C 11/00*    (2006.01)
(52) U.S. Cl. ........ 118/302; 118/667; 118/682; 118/688; 239/302; 239/601
(58) Field of Classification Search .................. 239/302, 239/601; 118/666–667, 302, 64, 66, 641–643, 118/58–60, 682, 688, 679
See application file for complete search history.

(56) References Cited

U.S. PATENT DOCUMENTS

| 4,457,259 | A |   | 7/1984 | Samuels |
|---|---|---|---|---|
| 4,827,867 | A | * | 5/1989 | Takei et al. ...................... 118/64 |
| 6,171,367 | B1 | * | 1/2001 | Peng et al. ......................... 95/46 |
| 6,254,936 | B1 | * | 7/2001 | Gurer et al. .................. 427/377 |
| 6,447,608 | B1 |   | 9/2002 | Sakai et al. |
| 6,863,741 | B2 | * | 3/2005 | Orii et al. ......................... 134/30 |
| 6,872,256 | B2 | * | 3/2005 | Kitano et al. ................. 118/323 |
| 6,911,091 | B2 |   | 6/2005 | Gurer et al. |
| 2001/0003964 | A1 |   | 6/2001 | Kitano et al. |
| 2010/0029088 | A1 |   | 2/2010 | Mayer et al. |

FOREIGN PATENT DOCUMENTS

| EP | 405527 | 1/1991 |
|---|---|---|
| JP | 61-154082 A | 7/1986 |
| JP | 02-174971 A | 7/1990 |
| JP | 5-20505 | 3/1993 |
| JP | H5-320919 A | 12/1993 |
| JP | 6-12446 | 2/1994 |
| JP | H06-012446 U | 2/1994 |
| JP | 2001-205151 A | 7/2001 |
| TW | 594421 B | 6/2004 |

* cited by examiner

*Primary Examiner* — Yewebdar T Tadesse
(74) *Attorney, Agent, or Firm* — Sughrue Mion, PLLC

(57) ABSTRACT

A film forming apparatus is provided which includes a device A that generates liquid fine particles having controlled particle diameters; a device B including a via for guiding the generated liquid fine particles while controlling a temperature thereof; a device C that sprays the guided liquid fine particles; and a device D including a space for forming a transparent conductive film by coating the sprayed liquid fine particles onto a subject to be processed.

16 Claims, 9 Drawing Sheets

NOZZLE DRIVING

SPRAYED MIST
QUANTITY DISTRIBUTION

NOZZLE DRIVING

SPRAYED MIST
QUANTITY DISTRIBUTION

NOZZLE DRIVING

SPRAYED MIST
QUANTITY DISTRIBUTION

NOZZLE DRIVING

SPRAYED MIST
QUANTITY DISTRIBUTION

FILM FORMING APPARATUS AND FILM FORMING METHOD

Priority is claimed from Japanese Patent Application No. 2005-265301, filed Sep. 13, 2005, the contents of which are incorporated herein by reference.

TECHNICAL FIELD

Apparatuses and methods consistent with the present invention relate to a film forming apparatus and a film forming method that are suitably used when a transparent conductive film or the like is being formed on a base material using a spray pyrolysis deposition (SPD) method, and that make it possible to spray droplets whose particle diameters have been made uniform in advance.

BACKGROUND ART

In solar cells, liquid crystal display (LCD) units, plasma display (PDP) units and the like of the related art, a base material with a transparent conductive film (TCF) that is obtained by forming the transparent conductive film on the transparent base material that is formed, for example, from glass or the like that is a non-conductive body is widely used.

These transparent conductive films are films whose main constituent is a conductive metallic oxide such as indium tin oxide (ITO), tin oxide (TO), and fluorine-doped tin oxide (FTO), and have a combination of excellent transparency to visible light and excellent electrical conductivity. Among these transparent conductive films, transparent conductive films having indium tin oxide (ITO), in particular, as their main constituent are widely known, and these are used in the liquid crystal display (LCD) units for personal computers (PC), televisions, and mobile telephones and the like.

One method of forming a transparent conductive film such as indium tin oxide (ITO) on a transparent base material is spray pyrolysis deposition (SPD).

This spray pyrolysis deposition is a technology involving a series of reactions. In this technology, a solution constituting a raw material is sprayed using a spraying device such as an atomizer onto a base material that has been preheated to a film formation temperature. In the initial stages of the resulting reaction, crystals are formed as a result of a vaporization of the solvent contained in the droplets that have been deposited on the surface of the base material and a reaction of solutes in the droplets. As the reaction progresses, droplets adhere onto the crystals (i.e., a polycrystalline substance) that have formed on the base material, and, as a result of a vaporization of the solvent in the droplets and a progress of the reaction between the solutes and the crystals underneath, crystalline (i.e., a polycrystalline substance) growth progresses.

In this spray pyrolysis deposition, an aqueous solution or alcohol solution of a metal inorganic salt, or an organic solution obtained by dissolving an organic metal compound or organic acid-base in an organic solvent, or a mixed solution obtained by mixing these solutions, or the like is used as the favorable raw material solution to be sprayed. The temperature of the base material differs depending on the type of starting material or raw material solution, however, the temperature range is set to 250 to 700° C. Because the film forming apparatus used in this type of spray pyrolysis deposition is simple and low in cost, it is effective when forming transparent conductive films at low cost.

A transparent conductive film (TCO: transparent conductive oxide) is glass that has been provided with conductivity by forming a thin film of a semiconductor ceramic such as tin-doped indium oxide (ITO), tin oxide (TO), or fluorine-doped tin oxide (FTO) on the surface of non-conductive glass, and has the property of conducting electricity in spite of being transparent. Among these, ITO, in particular, is widely known as a transparent conductive film and is used in the liquid crystal display units of personal computers, televisions, and mobile telephones and the like.

Using spray pyrolysis deposition, it is possible to form a transparent conductive film or the like at low cost because the film forming apparatus is simple and the raw material is also comparatively low in cost. An aqueous solution or alcohol solution of a metal inorganic salt, or an organic metal compound or organic solvent based solution of an organic acid-base is used for the starting material of the transparent conductive film. The temperature of the substrate differs depending on the starting material or raw material solution, however, the temperature range is set to 250 to 700° C.

However, in a related art film forming apparatus 1100 that includes a liquid supply component 1120 and a vapor supply component 1121 such as is shown in FIG. 1, in a fine particle formation device a, liquid that is supplied from the liquid supply component 1120 and vapor that is supplied from the vapor supply component 1121 are made to collide with each other so that the raw material solution formed by the two is changed into fine particles. When the raw material in fine particle form is sprayed onto a base material 1110 by a spray device c, the size of droplets 1122 that are sprayed from the spray device c is dependent on the spray nozzles (may also be hereinafter referred to as two-fluid spray nozzles) in the spray device c, and it is difficult to obtain a uniform size in the droplets 1122 which causes the film thickness to be uneven. Namely, in the preparation of a transparent conductive film using spray pyrolysis deposition inside a transparent conductive film forming device, when spray nozzles are used to spray a raw material solution onto a base material that has been heated to a temperature range of 250 to 700° C., the droplets 1122 that are sprayed from the spray nozzles have a size distribution of between 10 μm and 120 μm, as is shown by the related art apparatus in FIG. 6, even when two-fluid spray nozzles that allow fine particles to be formed are used. As a result, when forming a film over a large surface area, in-plane distribution ends up being generated in the sprayed droplets (i.e., mist) so that film thickness distribution is increased and a considerably high distribution is created in some film characteristics, such as sheet resistance and transmissivity.

Therefore, several devices have been proposed as devices to make the size of the sprayed droplets uniform. For example, it has been observed that, among droplets sprayed from spray nozzles, droplets having a large particle diameter are present in greater numbers at positions away from the center of the spray path. It has also been observed that coarse droplets contained in the vicinity of the center have a fast spray speed and fly further than fine droplets. Accordingly, technology has been proposed in which wall surfaces are provided at a front surface and surrounding the spray path so that droplets having a large particle diameter that fly to positions away from the center of the spray path and coarse droplets that fly far from the vicinity of the center collide with these wall surfaces and are removed (see Japanese Unexamined Patent Application, First Publication No. H05-320919 and Japanese Unexamined Patent Application, First Publication No. 2001-205151).

However, the above described devices attempt to make the size of the droplets uniform by efficiently selecting sprayed droplets, and do not spray droplets whose particle sizes have already been made uniform in advance. Accordingly, there is a limit as to how uniform the size of the droplets can be made and it is difficult to use only fine droplets to form a film.

Moreover, it is necessary for a sufficient distance, for example, approximately 500 mm to be provided between the discharged spray and the base material. This makes positive temperature control as well as control of the droplet spray speed and of the force of their collision with the base material impossible. As a result, film formation in which the film characteristics are precisely controlled has not been possible.

Another example of a related film forming apparatus that uses spray pyrolysis deposition is shown in FIG. 2. This film forming apparatus 2100 comprises a supporting device 2120 on which a substrate 2110 is mounted and with a discharge device 2130 that sprays a raw material solution in spray form. The supporting device 2120 has a heating device embedded therein that heats a mounted substrate to a predetermined temperature (see, for example, Japanese Utility Model Application No. H06-012446).

In order to spray mist uniformly onto a substrate having a large surface area at an angle of, for example, 200 mm or more, it is necessary to arrange and drive a large number of mist spray nozzles.

However, if mist is sprayed using related art circular nozzles (i.e., 60φ mm), then as is shown in FIGS. 3A and 3B, if the nozzles are driven in a circular shape or, as is shown in FIGS. 4A and 4B, if the nozzles are driven in an elliptical shape, the distribution is increased in the sprayed quantity of the mist. In order to reduce the effects of this distribution, it has been necessary to conduct even more complex drive control.

SUMMARY OF THE INVENTION

It is an exemplary object of the present invention to provide a film forming apparatus and a film forming method that make it possible to spray droplets whose particle diameters have been made uniform in advance.

It is a further exemplary object of the present invention to provide a film forming apparatus and a film forming method that make it possible to spray mist uniformly over a substrate having a large surface area and to make the thickness of the formed film uniform.

Exemplary embodiments of the present invention address the objects described above and other objects not described. Also, the present invention is not required to address the above-described objects.

Exemplary embodiments of the present invention provide the following film forming apparatus and film forming method that employ spray pyrolysis deposition.

Namely, a film forming apparatus that uses spray pyrolysis deposition according to a first aspect of the present invention includes: a device A that generates liquid fine particles, the liquid fine particles having controlled particle diameters; a device B that is defined by a space for guiding the generated liquid fine particles while controlling a temperature thereof; a device C that sprays the guided liquid fine particles; and a device D that is defined by a space for forming a transparent conductive film by coating the sprayed liquid fine particles onto a subject to be processed.

In this film formation apparatus that uses spray pyrolysis deposition a structure is employed in which, in the device A, liquid fine particles are generated whose particle diameters have been made uniform in advance by controlling the particle diameter of sprayed droplets. Next, in the device B, only liquid fine particles whose particles diameters have been made uniform are transported to the device C. Thereafter, in the device C, only minute liquid fine particles whose particle diameters have already been made uniform are sprayed onto a base material (i.e., a subject to be processed) that is placed in the space of the device D.

As a result, it is possible to form a film that has little unevenness in the film thickness.

In a film forming apparatus that uses spray pyrolysis deposition according to a second aspect of the present invention, in the device B, the space for guiding the liquid fine particles may be isolated from the outside by a partitioning member that has water repellency or has an internal surface that is undergone water repellency treatment. Water repellency may be achieved by providing a coating film that is suitable for imparting water repellency, such as Teflon® resin or a vinyl chloride resin or the like, and providing conditions of a contact angle of 80° or more for the contact between the liquid fine particles and the interior wall of the delivery path that transports the liquid fine particles while guiding them.

By employing this type of structure, it is possible to reduce effects from the outside temperature while suppressing adhesion of the liquid fine particles to the partitioning plate.

In a film forming apparatus that uses spray pyrolysis deposition according to a third aspect of the present invention, in the device B, it is also possible for the space for guiding the liquid fine particles to be isolated from the outside by a partitioning member and to have a mechanism that performs temperature control such that a temperature inside the space is kept at a higher temperature than the outside.

By employing this type of structure, adhesion of liquid fine droplets to the interior wall of the delivery path due to condensation or the like and a bonding together of the liquid fine particles can be suppressed so that it is possible to supply, stably, liquid fine particles whose particle diameters have been made uniform to the device C.

A film forming apparatus according to a fourth aspect of the present invention is a film forming apparatus that forms a thin film on a surface of a subject to be processed by spray pyrolysis deposition and includes: a supporting device on which the subject to be processed is mounted; and a discharging device that sprays a mist containing a raw material solution for the thin film towards a surface of the subject to be processed, wherein the discharge device comprises nozzles, each nozzle having a first position that forms a mist intake side and a second position that forms a mist discharge side, and if a face velocity at the first position is taken as $V_1$ and a face velocity at the second position is taken as $V_2$, a face velocity of the mist moving through the nozzles is $V_2 > 1.5 \times V_1$.

In a film forming apparatus according to a fifth aspect of the present invention, in the above described film forming apparatus 1, in the nozzles, if a cross-sectional area of the first portion when seen from the discharge aperture side is taken as $E_1$ and a cross-sectional area of the second portion is taken as $E_2$, $E_1 > 1.5 \times E_2$.

In a film forming apparatus according to a sixth aspect of the present invention, in the above described film forming apparatus, the shape of the nozzles at the second position is a slit shape.

In a film forming apparatus according to a seventh aspect of the present invention, in the above described film forming apparatus, there are further provided: a preparation chamber where the mist is generated by spraying in advance the raw material solution; and a transporting device that is defined by a space that enables the mist to move from the preparation chamber to the nozzles.

In a film forming apparatus according to an eighth aspect of the present invention, in the above described film forming apparatus, during film formation the nozzles are shifted in a horizontal direction relative to a surface of the subject to be processed.

In a film forming apparatus according to a ninth aspect of the present invention, in the above described film forming apparatus, if the movement in a horizontal direction of the nozzles is a reciprocating movement, then in a vicinity of a turn portion, the nozzles are shifted in a direction in which they move away from the surface of the subject to be processed.

A film forming method according to a tenth aspect of the present invention is a film forming method for forming a film on a base material by spray pyrolysis deposition that includes: generating liquid fine particles having controlled particle diameters; performing temperature control on generated liquid fine particles and guiding them with the particle diameters thereof made uniform; spraying the guided liquid fine particles; and forming a film by causing the sprayed liquid fine particles to accumulate on the base material.

As a result of the above, because it is possible to form a film using only liquid fine particles whose particle diameters have been made precisely uniform, it is possible to form a film having little film thickness distribution.

According to the film forming apparatus that uses spray pyrolysis deposition of an exemplary embodiment of the present invention, by introducing liquid fine particles, whose particle diameters are controlled, via a space that guides them while controlling their temperature to nozzles serving as a spraying device, it becomes possible for the in-plane distribution of the liquid fine particles that are sprayed from the nozzles to be made uniform, and the in-plane distribution range of the film characteristics can be contracted (i.e., narrowed).

Consequently, a film forming apparatus according to an exemplary embodiment of the present invention contributes to fields in which a transparent conductive film having a large surface area is required, for example, fields such as liquid crystal display devices and EL display devices.

In an exemplary film forming method of the present invention, because a transparent conductive film is formed using liquid fine particles whose particle diameters have been made uniform, it becomes possible to form a uniform and homogeneous film irrespectively of the surface area of the base material (i.e., the subject to be processed).

Consequently, the construction of a production system that produces, in large quantities, transparent conductive films having a large surface area is possible.

According to an exemplary embodiment of the present invention, if nozzles are provided in a discharge device that sprays mist that is formed by the raw material solution of a thin film, by stipulating that a relationship between a face velocity $V_1$ of the mist at a first position and a face velocity $V_2$ of the mist at a second position satisfy $V_2 > 1.5 \times V_1$, it becomes possible to provide a film forming apparatus that is capable of achieving a uniform spray amount over the entire surface of a subject to be processed and of achieving an improvement in the film formation speed.

DETAILED DESCRIPTION OF EXEMPLARY EMBODIMENTS OF THE INVENTION

A first exemplary embodiment of the present invention will now be described.

Figure 5:
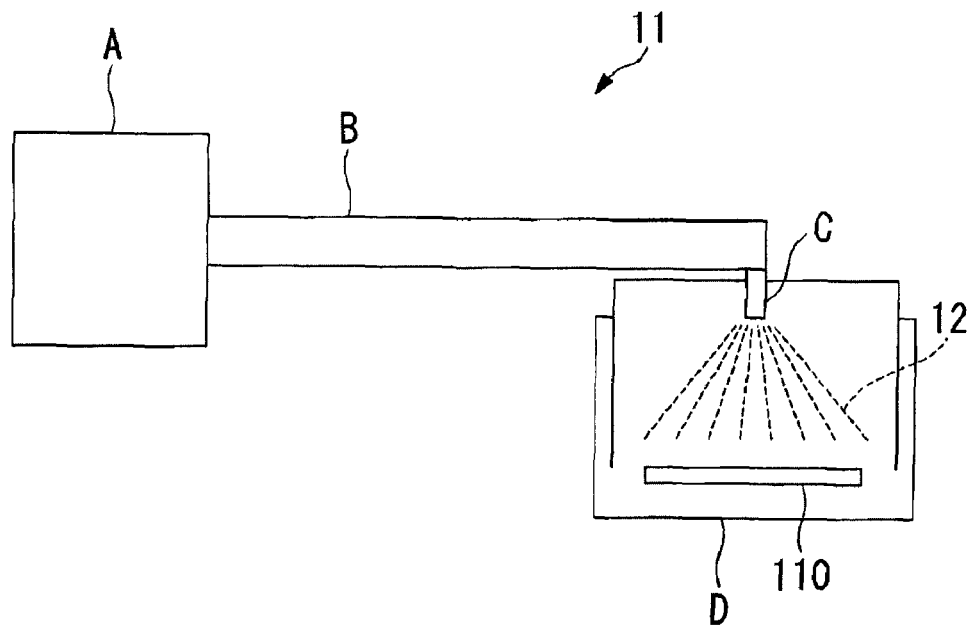
FIG. 5 is a schematic view showing the structure of an example of a film forming apparatus of an exemplary embodiment of the present invention.

FIG. 5 is a schematic view showing a structure of a film forming apparatus according to the present embodiment.

A film forming apparatus 11 according to the present embodiment comprises a device A (hereinafter referred to as a "liquid fine particle generating device") that generates first liquid fine particles whose particle diameter is controlled, a device B (hereinafter referred to as a "liquid fine particle guiding device") that is defined by a space that guides the generated first liquid fine particles while performing temperature control thereof, a device C (hereinafter referred to as a "liquid fine particle spraying device") that converts the guided first liquid fine particles into finer second liquid fine particles 12 and then sprays these, and a device D (hereinafter referred to as a "transparent conductive film forming device") that is defined by a space that makes the sprayed second liquid fine particles 12 coated onto a subject to be processed (i.e., base material) in the form of a glass substrate 110 so as to form a transparent conductive film.

The liquid fine particle generating device A controls droplets that have been sprayed preliminarily using a spray device that is different from the liquid fine particle spraying device C (described below) so as to make a selection such that only droplets having a small diameter (i.e., fine droplets) are efficiently extracted as first liquid fine particles so that the size thereof is made uniform.

The generated first liquid fine particles may contain between 60.0% by volume and 98.8% by volume of air.

The liquid fine particles guiding device B has a delivery path in the form of a space where the first liquid fine particles that were generated with a controlled particle diameter by the liquid fine particle generating device A are transported while being guided such that there is no damage to the particle diameter from the liquid fine particle generating device A as far as the subsequent liquid fine particle spraying device C.

This delivery path is isolated from the outside by a partitioning member, and is controlled such that the temperature of the interior walls is the same as or higher than that of the liquid fine particles. In addition, the temperature thereof is maintained such that the evaporation rate of the solvent in the transparent conductive film raw material solution does not become excessive. Namely, such that a relationship is established whereby the liquid fine particle temperature>delivery path internal wall temperature>solvent evaporation temperature.

In addition, a flow having a flow rate of between 100 cm/min and 100,000 cm/min is present in the liquid fine particles inside the delivery.

Moreover, the interior walls of the delivery path are isolated from the outside by using a material having water repellency such as a fluororesin or the like, or by performing processing to impart water repellency to the surfaces thereof. At this time, if a material having excellent heat propagation properties such as a metal is used for the delivery, then it is easily affected by the outside temperature and may lead to liquid fine particles adhering to the interior walls of the delivery. Because of this, a resin material having low heat propagation such as a vinyl chloride resin or a fluororesin or the like may be used. Note that if a metal material is used, this can be addressed by performing temperature control on the outside walls of the delivery.

Moreover, if hydrochloric acid, sulfuric acid, or nitric acid is used for the chemical solution, then it is necessary to use a material having chemical resistant properties for the interior walls that are in direct contact with the liquid fine particles, or to perform surface treatment thereon using a material having chemical resistant properties.

Furthermore, the distance of the delivery path may be short. However, it is also possible to think of cases when some distance is required from the viewpoint of design such as restrictions imposed by the temperature of the liquid fine particles and the temperature of the interior walls, and the placement from various devices. When this distance is increased, it may be less than 10 meters.

The liquid fine particle spray device C sprays liquid fine particles that have been guided by the liquid fine particle guiding device B onto the glass substrate 110 that is placed in the space of the subsequent transparent conductive film forming device D. Liquid fine particles are sprayed at a flow rate of between 1,000 cm/min and 100,000 cm/min from a discharge aperture in the liquid fine particle spraying device C. The distance between the discharge aperture in the liquid fine particle spraying device C and the surface of the glass substrate 110 is controlled so as to be between 5 mm and 200 mm.

The transparent conductive film forming device D is positioned facing the discharge aperture in the liquid fine particle spraying device C and comprises a space for mounting the glass substrate 110 on which the liquid fine particles that form a transparent conductive film are deposited. In the transparent conductive film forming device D, a raw material solution for a transparent conductive film that contains conductive polymers that have been sprayed onto the glass substrate 110 is coated so as to form an initial layer of the transparent conductive film.

The surface of the glass substrate 110 is heated by heat transfer from a substrate heater located beneath it, heat ray irradiation from a heat ray heater located above it, and by a high temperature flow from an upper atmosphere, so that the temperature range is controlled to between 200° C. and 600° C.

Next, the film forming method for forming the transparent conductive film according to the present embodiment will be described.

Firstly, liquid fine particles whose particle diameter is controlled by the liquid particle generating device A are generated. Next, the temperature of the generated liquid fine particles is controlled by the liquid fine particle guiding device B and the liquid fine particles having uniform particle diameters are guided to the liquid fine particle spraying device C. Thereafter, the guided liquid fine particles are sprayed onto a subject to be processed by the liquid fine particle spraying device C and the liquid fine particles 12 that have been sprayed in the transparent conductive film forming device D are deposited on the glass substrate 110 that is serving as a subject to be processed so that a film is formed.

The film forming apparatus according to a second exemplary embodiment of the present invention will now be described based on the drawings.

Figure 7:
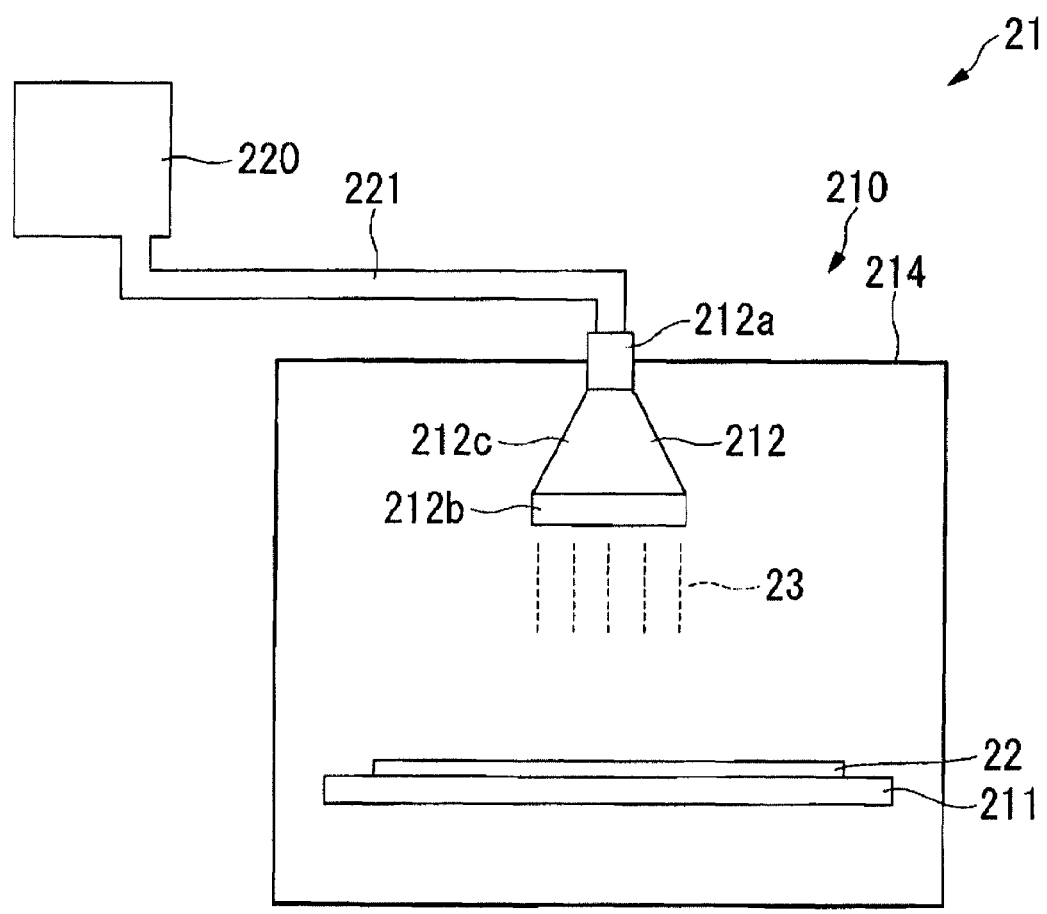
FIG. 7 is a view schematically showing another example of a film forming apparatus of an exemplary embodiment of the present invention.

FIG. 7 is a view schematically showing a film forming apparatus according to the second embodiment of the present invention A film forming apparatus 21 is a film forming apparatus that forms a thin film on a subject 22 to be processed by spray pyrolysis deposition and includes a supporting device 211 on which the subject to be processed 22 is mounted, and a discharging device 212 that sprays a mist 23 that is formed from a raw material solution for the thin film onto a surface of the subject 22 to be processed.

Moreover, in a film forming apparatus 21 of this embodiment, the nozzle provided in the discharge device 212 has a first portion 212a that forms the mist intake side and a second portion 212b that forms the mist discharge side, and a third portion 212c. Regarding the face velocity of mist moving through the nozzle, the face velocity $V_1$ in the first portion 212a and the face velocity $V_2$ of the second portion 212b are set so as to satisfy the following formula.

$$V_2 > 1.5 \times V_1 \qquad (1)$$

By regulating the face velocity $V_1$ of the mist in the first portion 212a and the face velocity $V_2$ of the mist in the second portion 212b in the manner described above, the sprayed mist quantity over the entire surface of the subject 22 to be processed is made uniform and the film formation rate can be increased.

The supporting device 211 has a temperature control device embedded therein that includes functions of heating, maintaining the temperature of, and cooling the subject 22 to be processed in order to form a thin film while keeping the surface of the subject 22 to be processed on which a film is being formed at a predetermined temperature. The temperature control device is, for example, a heater.

The discharge device 212 sprays mist 23 onto the subject 22 to be processed that is placed in a space in a film formation chamber 210. The mist 23 is sprayed at a flow rate of between 100 cm/min and 100,000 cm/min from the discharge aperture of the discharge device 212. The distance between the discharge device 212 and the surface of the subject to be processed 2 is controlled between 5 mm and 200 mm.

The discharge device 212 is, for example, a nozzle. Moreover, the raw material solution that is sprayed from the discharge device 212 is the mist 23 (i.e., liquid fine particles).

This mist 23 may also be generated by spraying raw material solution in advance in a preparation chamber 220 (described below).

In addition, the surface of the subject 22 to be processed is heated by heat transfer or the like from the temperature control device, and the temperature range is controlled to between 200° C. and 600° C.

In the film forming apparatus 21 of the present invention, in the nozzle provided in the discharge device 212, when viewed from the discharge aperture side a cross-sectional area $E_1$ of the first portion 212a and a cross-sectional area $E_2$ of the second portion 212b are set so as to satisfy the following formula.

$$E_1 > 1.5 \times E_2 \quad (2)$$

In the nozzle, by regulating the cross-sectional area $E_1$ of the first portion 212a and the cross-sectional area $E_2$ of the second portion 212b in the above manner, the face velocity of the mist moving inside the nozzle can be easily changed between the first portion 212a and the second portion 212b. Note that the cross-sectional areas $E_1$ and $E_2$ are the cross-sectional areas of the nozzle internal dimension.

Specifically, a relationship between the mist face velocity $V_1$ in the first portion 212a and the mist face velocity $V_2$ in the second portion 212b can be set to $V_2 > 1.5 \times V_1$.

The first portion 212a may be circular and the second portion 212b may be slit-shaped. By making the second portion 212b that forms the discharge aperture slit-shaped, mist can be sprayed uniformly even onto a subject to be processed that has a large surface area so that a film can be formed uniformly.

Figure 8:
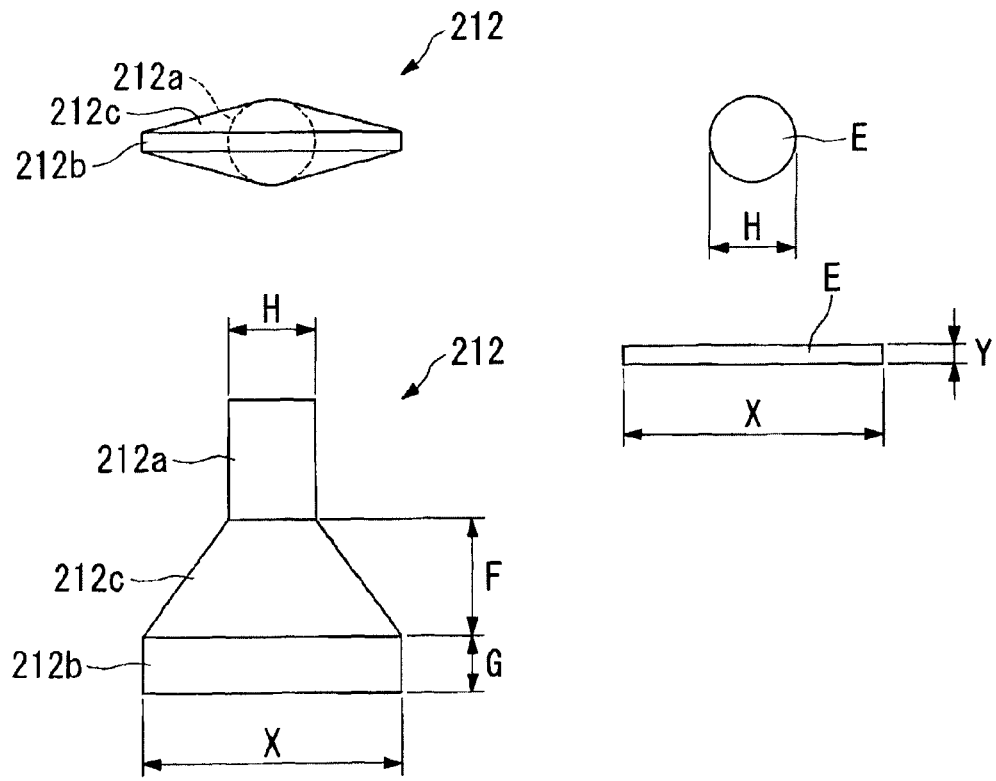
FIG. 8 is a view showing the nozzles shown in FIG. 7.

Furthermore, in a slit-shaped discharge aperture, as is shown in FIG. 8, the nozzle shape is designed such that no difference is generated between the mist flow rate in a center portion and the mist flow rate at end portions. FIG. 8 is an view of a nozzle portion.

As is shown in FIG. 8, an inner diameter H of the first portion 212a (i.e., a cylindrical portion), a length X and a width Y of the aperture portion of the second portion 212b (i.e., a slit portion), a length G of the second portion 212b, and a length F of a third portion (i.e., a constricted portion) that connects the first portion 212a to the second portion 212b are set so as to satisfy the following formula.

$$(X-H) < 2.5 \times F (F \leq G) \quad (3)$$

By designing the nozzle shape such that Formula (3) is satisfied, the mist flow rate in a slit-shaped discharge aperture can be made equal in a center portion and at end portions, and mist can be sprayed uniformly onto the subject 22 to be processed.

Moreover, during film formation, the nozzle is moved in a horizontal direction along one surface of the subject 22 to be processed. By moving the nozzle, a film can be formed uniformly even on a subject to be processed that has a large surface area.

Figure 9:
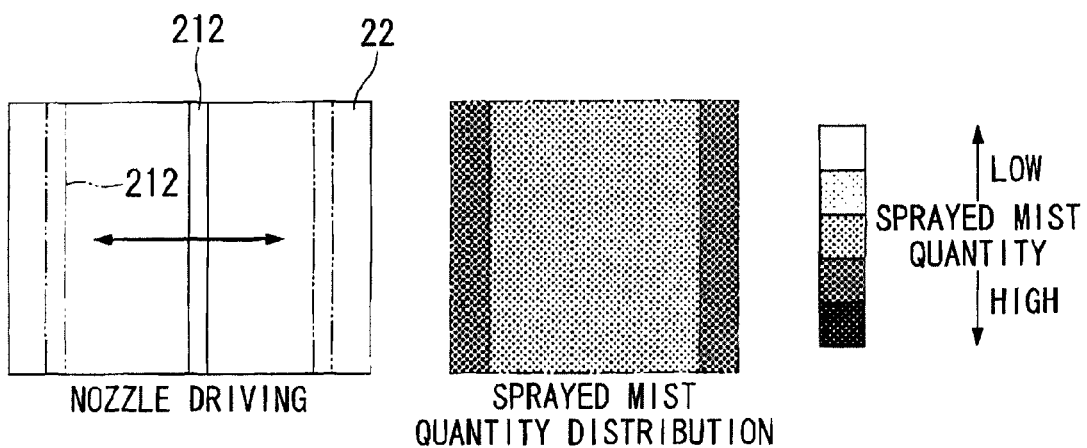
FIG. 9 is a view showing a nozzle driving pattern and a sprayed mist distribution.

At this time, by making the movement of the nozzle in a horizontal direction a reciprocating movement, it becomes possible to form a film on a subject to be processed that has a larger surface area, however, as is shown in FIG. 9, there is a tendency for the spray quantity distribution to become concentrated in driving turning portions (i.e., in turn portions). This is because it is difficult to control the nozzle during turning. Namely, at the stage when nozzle turn control is begun, the nozzle shift speed is decreased so that the spray quantity in these areas increases.

Therefore, in order to avoid the sprayed mist quantity becoming concentrated in turn portions, at the stage when nozzle turn control is begun, the spray height of the nozzle may be controlled proportionally as the nozzle shift speed is decreased.

Figure 10:
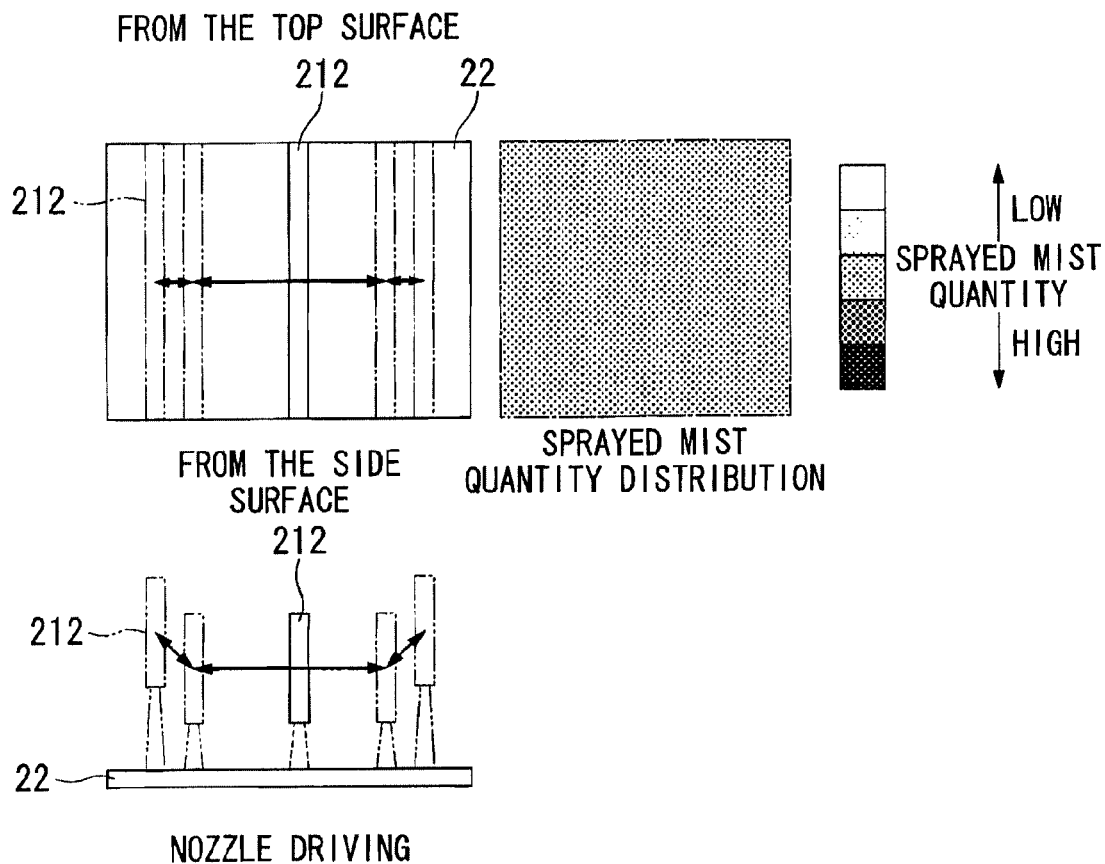
FIG. 10 is a view showing a nozzle driving pattern and a sprayed mist distribution.

Namely, in the film forming apparatus 21, if the movement of the nozzle in a horizontal direction is a reciprocating movement, then as is shown in FIG. 10, in the vicinity of the turn portions the nozzle is moved in a direction in which it moves away from a surface of the subject 22 to be processed.

In end portions of the subject 22 to be processed which form turn portions in a reciprocating movement, by performing film formation while raising the height of the nozzle from the surface of the subject 22 to be processed, the sprayed mist quantity can be made uniform over the entire surface of the subject 22 to be processed. As a result, it is possible to reduce any unevenness in the film thickness of a formed thin film.

Moreover, this film forming apparatus 21 is further provided with a preparation chamber 220 that generates the mist 23 by spraying a raw material solution in advance, and a transporting device that is defined by a space and moves the mist 23 from the preparation chamber 220 to the discharge device 212.

In the preparation chamber 220, the raw material solution is sprayed in advance using a spraying device that is different from the above described spraying device 212 and control is performed to make a selection such that only droplets having a small diameter (i.e., fine) are efficiently extracted as the mist 23 so that the size thereof is made uniform. Because a finer mist can be sprayed a film having good characteristics can be formed.

The generated mist 23 may contain between 60.0% by volume and 98.8% by volume of air.

The transporting device has a delivery path 221 in the form of a space where the generated mist 23 is transported while being guided.

The delivery path 221 is isolated from the outside by a partitioning member, and is controlled such that the temperature of the interior walls is the same as or higher than that of the mist 23. In addition, the temperature thereof is maintained such that the evaporation rate of the solvent in the raw material solution does not become excessive. Namely, a relationship whereby the mist 23 temperature>delivery path 221 internal wall temperature>solvent evaporation temperature.

In addition, a flow having a flow rate of between 100 cm/min and 100,000 cm/min is present in the mist 23 inside the delivery path 221.

Moreover, the interior walls of the delivery path 221 are isolated from the outside by using a material having water repellency such as a fluororesin or the like, or by performing processing to impart water repellency to the surfaces thereof. At this time, if a material having excellent heat propagation properties such as a metal is used for the delivery path 221, then it is easily affected by the outside temperature and may lead to the mist 23 adhering to the interior walls of the delivery. Because of this, a resin material having low heat propagation such as a vinyl chloride resin or a fluororesin or the like may be used. Note that if a metal material is used, this can be addressed by performing temperature control on the outside walls of the delivery.

Moreover, if a chemical solution, such as hydrochloric acid, sulfuric acid, or nitric acid, is used, then it is necessary to use a material having chemical resistant properties for the interior walls that are in direct contact with the mist 23, or to perform surface treatment thereon using a material having chemical resistant properties.

Furthermore, the distance of the delivery path 221 may be short. However, it is also possible to think of cases when some distance is required from the viewpoint of design such as restrictions imposed by the temperature of the liquid fine particles and the temperature of the interior walls, and the placement from various devices. When this distance is increased, it may be less than 10 meters.

Moreover, in this film forming chamber, a space that includes the subject 22 may be processed and the discharge device 212 may be enclosed in a hood 214.

The hood 214 is formed from a non-corrosive metal such as stainless steel. Aperture portions are formed on both sides in the vicinity of the bottom portion.

In the film forming apparatus 21, because the hood 214 is positioned so as to enclose the space between the discharge device 212 and the subject 22 to be processed that is placed in a position facing the discharge device 212, raw material solution that is discharged in spray form from the discharge aperture of the discharge device 212 is not affected by the outside air, and a state can be stably maintained in which the raw material solution is sprayed from the discharge aperture into a radial space in the direction of the subject 22 to be processed. In other words, the hood 214 also helps to prevent raw material solution scattering from the space inside the hood 214 to the outside of the apparatus and causing an unnecessary increase in the amount used. As a result, the raw material solution is used effectively to form a thin film.

Moreover, because the hood 214 is positioned so as to enclose the space between the discharge device 212 and the subject 22 to be processed, during film formation, heat dissipation from the subject 22 to be processed can be suppressed. As a result, it becomes possible to reduce the amount of heat that is required to heat the subject 22 to be processed and the controllability of the surface temperature of the subject 22 to be processed is improved.

Next, a method of forming a thin film on the subject 22 to be processed by spray pyrolysis deposition using this film forming apparatus 21 will be described.

Note that in the description given below, the description uses as an example a case in which an ITO film is formed as a transparent conductive film on a substrate in the form of the subject 22 to be processed using the film forming apparatus 21 of the present embodiment, however, the present invention is not limited to this and can also be used to form a variety of thin films.

Firstly, a substrate whose surface is a clean surface is mounted on a base and this substrate and base are held together in a predetermined position.

A glass plate having a thickness of approximately between 0.3 mm and 5 mm that is formed from a glass such as, for example, soda glass, heat-resistant glass, or quartz glass may be used for the substrate.

Once the substrate surface temperature has reached a predetermined temperature and stabilized, formation of the ITO film commences.

In the preparation chamber 220, the raw material solution for the ITO film is sprayed in preparation using a spraying device so as to form the mist 23.

A solution containing components that form a conductive metallic oxide such as indium tin oxide (ITO) or the like as a result of being heated may be used as the raw material solution for the ITO film.

An aqueous solution or ethanol solution or ethanol-water mixture solution containing 0.01 mol/L of tin chloride pentahydrate in an aqueous solution or ethanol solution or ethanol-water mixture solution containing 0.2 mol/L of indium chloride tetrahydrate may be used as the raw material solution for the ITO film.

The mist 23 that is generated in the preparation chamber 220 is transported via the delivery path 221 to the film formation chamber 210, and is then sprayed from the nozzle (i.e., the discharge device 212) located in the top of the film formation chamber 210 towards the top of the substrate. As a result of this mist 23 adhering to the surface of the substrate that has been heated to a predetermined temperature, the solvent in the mist is rapidly evaporated and any remaining solute undergoes a rapid chemical reaction and changes into a conductive metallic oxide such as ITO or the like. As a result, crystals that are formed by the conductive metallic oxide are rapidly generated on the surface of the substrate and a transparent conductive film (i.e., an ITO film) is formed over a short period of time.

At this time, if the face velocity of the mist moving through the nozzle is designated such that the face velocity at the first portion 212a, which is the mist intake side, is taken as $V_1$ and the face velocity at the second portion 212b, which is the mist discharge side, is taken as $V_2$, then $V_2 > 1.5 \times V_1$. The second portion 212b that forms the discharge aperture is slit-shaped.

The nozzle is further moved in a horizontal direction along one surface of the substrate. If this movement of the nozzle in a horizontal direction is a reciprocating movement, then in the vicinity of the turn portion, the nozzle is moved in a direction in which it moves away from the surface of the substrate.

Once the formation of the ITO film is completed, it is cooled until the substrate temperature reaches a predetermined temperature and the substrate is then removed.

In this manner, a transparent conductive film that is made up of an ITO film is formed on the substrate.

In this film forming apparatus 21, if the face velocity of the mist moving through the nozzle is designated such that the face velocity at the first portion 212a, which is the mist intake side, is taken as $V_1$ and the face velocity at the second portion 212b, which is the mist discharge side, is taken as $V_2$, then $V_2 > 1.5 \times V_1$. By this means, the amount of mist sprayed over the entire surface of the subject 22 to be processed can be made uniform, and it is possible to improve the film forming speed.

Furthermore, the nozzle is moved in a horizontal direction along one surface of the subject 22 to be processed. If this movement of the nozzle in a horizontal direction is a reciprocating movement, then in the vicinity of the turn portion, the nozzle is moved in a direction in which it moves away from the surface of the subject 22 to be processed. By this means, the amount of mist sprayed over the entire surface of the subject 22 to be processed can be made uniform.

As a result, a transparent conductive film that is obtained in this manner ends up having suppressed unevenness in the film thickness distribution over a large surface area. In addition, the in-plane uniformity of thin film characteristics such as, for example, sheet resistance and transmissivity is ensured, and a high quality product is obtained.

A description has been given above of film forming apparatuses of exemplary embodiments of the present invention, however, the present invention is not limited to the above examples and can be appropriately altered as is necessary.

EXAMPLES

Next, examples of the present invention will be described. These are specific examples that make it possible for the present invention to be more fully understood, however, the present invention is not limited to these examples.

First Example

Firstly, in Example 1-1, an indium tin oxide (ITO) film is formed as a transparent conductive film. The solution that forms the raw material for this ITO film was prepared by dissolving 5.58 g of indium chloride (III) pentahydrate ($InCl_3 \cdot 5H_2O$, molecular weight: 293.24) and 0.32 g of tin chloride (IV) pentahydrate ($SnCl_4 \cdot 5H_2O$, molecular weight: 350.60) in 100 ml of pure water serving as a solvent.

In Example 1-1, using the conditions shown in Table 1 below, liquid fine particles that were generated by the liquid fine particle generating device A were guided to the liquid fine particle guiding device B. Moreover, a bellows pipe made from vinyl chloride that can be elongated or contracted was used for the delivery path of the liquid fine particle guiding device B that guides the liquid fine particles, and water repellency was ensured by treating the internal surface thereof with a fluororesin.

TABLE 1

| Item | Parameter |
| --- | --- |
| Starting raw material | $InCl_3 \cdot 5H_2O$, $SnCl_4$ |
| Solvent | Water |
| Temperature of liquid fine particles after generation | 23° C. |
| Temperature of liquid fine particles inside delivery path | 23° C. |
| Delivery path exterior temperature | 22° C. |
| Proportion of droplets in liquid fine particles | 1.5% by volume |
| Flow rate of liquid fine particles being transported | 7,000 cm/min |
| Length of delivery path | 2.0 m |

Moreover, in Example 1-1, using the conditions shown in Table 2 below, liquid fine particles that were guided by the liquid fine particle guiding device B were sprayed by the nozzle of the liquid fine particle spraying device C onto the glass substrate 110 serving as a subject to be processed.

TABLE 2

| Item | Parameter |
| --- | --- |
| Nozzle aperture size | 60 φmm |
| Liquid fine particle temperature (at nozzle aperture) | 40° C. |
| Flow rate of liquid fine particles at nozzle aperture | 15,000 cm/min |
| Number of nozzles | 4 |
| Distance between nozzle and base material | 20 mm |
| Spraying time | 15 min. |

The volume distribution ratio relative to the particle diameter of the liquid fine particles generated on the basis of the above conditions was then measured and the droplet size distribution thereof was compared with that of droplets generated using a conventional apparatus in which the vapor supplied from the vapor supply component and the liquid that is supplied from the liquid supply component are made to collide with each other so that the raw material solution formed by the two is changed into fine particles, and this raw material solution that has been changed into fine particles is sprayed onto a base material by two-fluid spray nozzles. Note that a microscopic mist generating apparatus manufactured by Atomax Co. Ltd. was used for the spray nozzles in the present example. The results are shown in FIG. 6.

Figure 6:
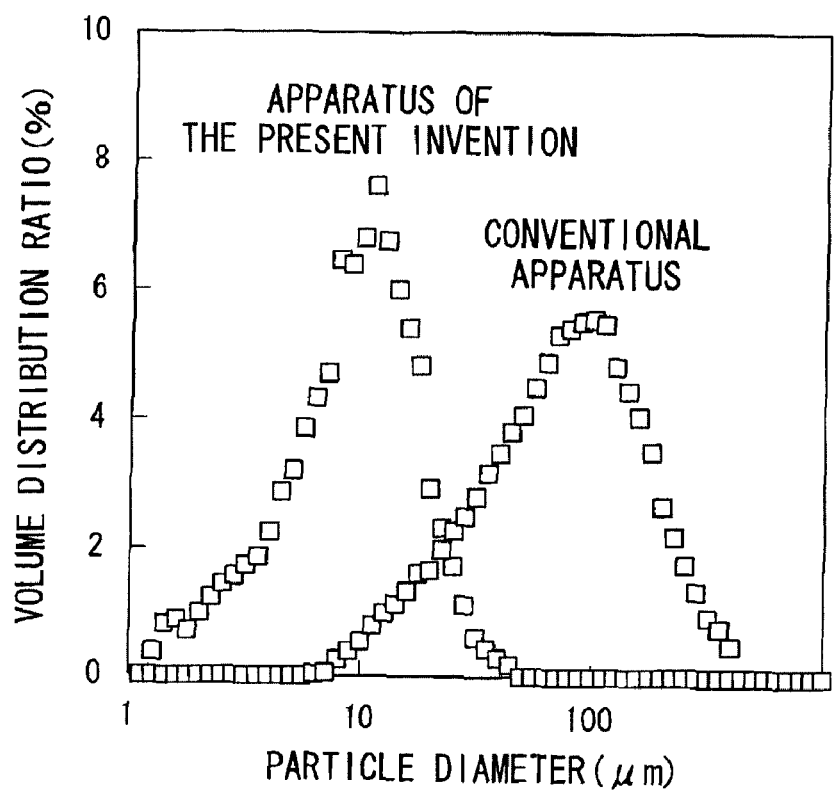
FIG. 6 is a view showing a size distribution of fine particles in liquid form controlled by a film forming apparatus of an exemplary embodiment of the present invention as compared with a conventional apparatus.

As is shown in FIG. 6, in a related art apparatus the droplet size distribution is between 9 μm and 160 μm, while in an apparatus that is based on the present example the droplet size distribution is between 1 μm and 60 μm so that the size of the droplet size distribution is reduced. As a result, droplets of 70 μm or larger can be removed and it becomes possible to spray droplets that have a uniform particle diameter.

Moreover, in Example 1-1, a borosilicate glass plate having a size of 500 mm×500 mm and a thickness of 2 mm was used for the base material, and the film thickness, sheet resistance, and transmissivity to visible light of an ITO film that was formed under the above described conditions with the surface temperature of the glass substrate set to 350° C. were each measured and compared with the same measurement results from a related art apparatus. The results are shown in Table 3.

TABLE 3

| Item | Example 1-1 apparatus | Related Art apparatus |
|---|---|---|
| Surface temperature of glass substrate | 350° C. | 350° C. |
| Film thickness distribution | 610 to 650 nm | 620 to 750 nm |
| Sheet resistance distribution | 3 to 5 Ω/cm$^2$ | 10 to 35 Ωcm$^2$ |
| Transmissivity | 80% | 70% |

From the results in Table 3, it can be understood that, in an apparatus that is based on an exemplary embodiment of the present invention, it is possible to contribute to the uniformity of the film thickness distribution and to the uniformity of the sheet resistance distribution, and to improve the film quality including transmissivity.

Moreover, in Example 1-1, using a borosilicate glass plate having a size of 500 mm×500 mm and a thickness of 2 mm for the base material, in order to achieve a 500 mm×500 mm film formation, on the substrate side this glass plate was driven ±150 mm in a direction taking a horizontal direction as the X axis, and on the nozzle side was driven ±100 mm in a direction taking a horizontal direction that is orthogonal to the X axial direction on the substrate side as the Y axis. Accordingly, a substrate-nozzle direction that is vertically orthogonal to both the X axial direction on the substrate side and the Y axial direction on the nozzle side is taken as a Z axial direction. The substrate was then heated under the combined conditions (A)+(B) shown in Table 4 below.

TABLE 4

| Item | Parameter |
|---|---|
| Type of coated film substrate | Borosilicate glass (TEMPAX #8330) |
| Coated film substrate size | 500 × 500 × 2 mm |
| Coated film substrate surface temperature | 300 to 450° C. |
| Heating conditions | (A) Heat transfer heating from substrate rear surface side + (B) Heat ray irradiation heating from substrate front surface (i.e., formed film surface) side |
| Drive method (for film formation over a large surface area) | Drive in X axial direction of substrate side (±150 mm) + drive in Y axial direction of nozzle side (±150 mm) |

The film thickness distribution, sheet resistance distribution, and transmissivity distribution in visible light of an ITO film that was formed under the above described conditions were each measured and compared with the same measurement results from a related art apparatus. The results are shown in Table 5. Note that the film formation time was 15 minutes for both the apparatus of the present example and the conventional apparatus.

TABLE 5

| Item | Example 1-1 apparatus | Related art apparatus |
|---|---|---|
| Film thickness distribution | 700 to 900 nm | 200 to 1200 nm |
| Sheet resistance distribution | 3 to 4 Ω/cm$^2$ | 5 to 15 Ω/cm$^2$ |
| Transmissivity distribution (overall light ray transmissivity) | 75 to 83% | 60 to 82% |
| Film formation time | 15 min. | |

From the results shown in Table 5, it can be understood that in the same film formation time the film growth is more rapid and there is reduced film thickness distribution and sheet resistance distribution, and there is also a significant improvement in the transmissivity characteristic.

It is thought that this is an effect of the fact that the in-plane distribution of the liquid fine particles that are sprayed from the nozzles have been made uniform, the fact that it has become possible to spray with the nozzles placed in close proximity to the substrate (i.e., conventionally, 500 mm compared to 20 mm in Example 1-1), the fact that it is possible to control the flow rate of the liquid fine particles that are sprayed from the nozzles, and the fact that it is possible to control the temperature of the liquid fine particles until they reach the substrate.

Example 2

Using a film forming apparatus of an exemplary embodiment of the present invention, an ITO film was formed as a transparent conductive film on the substrate.

Firstly, a raw material solution was prepared in the manner described below.

Preparation of ITO Raw Material Solution

The solution was prepared by dissolving chemical agents in a ratio of 5.58 g/100 ml of indium chloride (III) tetrahydrate ($InCl_3 \cdot 4H_2O$) and 0.36 g of tin chloride (IV) pentahydrate ($SnCl_4 \cdot 5H_2O$) in water.

Example 2-1

ITO Film Formation

A 500 mm×500 mm×2 mm$^t$ borosilicate glass substrate (TEMPAX #8330) was mounted on a supporting base and was heated from room temperature until the surface temperature reached 300 to 450° C. Note that the heating was provided by heat ray heating from an infrared lamp placed above the hood in addition to heat transfer from a heating substrate placed below the glass substrate.

Once it was confirmed that the surface temperature of the substrate was stable, ITO film formation was commenced.

The ITO raw material solution is sprayed in advance in a preparation chamber so as to form mist (i.e., liquid fine particles).

The mist conditions in the preparation chamber and on the delivery path are shown in Table 6. Note that a bellows pipe made from vinyl chloride that can be elongated or contracted is used for the delivery, and water repellency was ensured by providing a Teflon® coating on the internal wall thereof.

TABLE 6

| | |
|---|---|
| Temperature of mist in preprocessing chamber | 23° C. |
| Temperature of mist on delivery | 23° C. |
| Delivery path exterior temperature | 22° C. |
| Proportion of droplets in mist | 1.5% by volume |
| Flow rate of mist being transported | 7,000 cm/min |
| Length of delivery path | 2.0 m |

Figure 11:
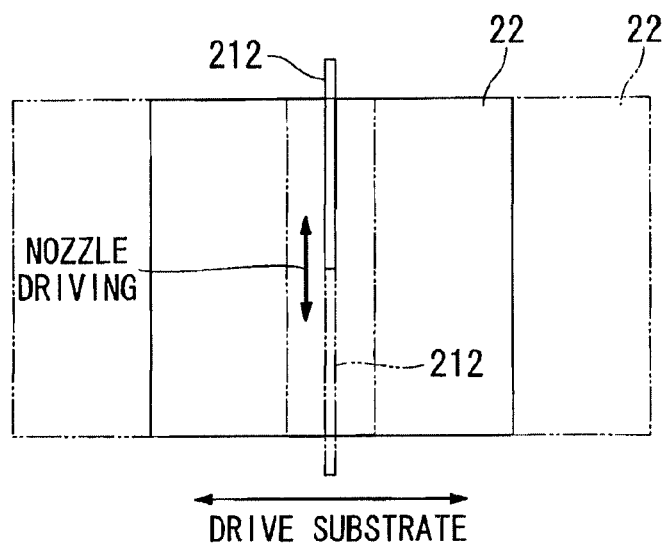
FIG. 11 is a view showing a placement and driving of nozzles.

In the film formation chamber, four slit-shaped spray nozzles (having a nozzle discharge aperture size of: 7×270 mm) were placed in the manner shown in FIG. 11 and the mist from the ITO raw material solution that had been transported from the preparation chamber was sprayed onto the substrate. At this time, the temperature of the mist in the nozzle discharge apertures was 40° C., and the mist flow rate in the nozzle discharge apertures was 22500 cm/min.

Moreover, in order to achieve a 500 mm×500 mm film formation, the distance between the spray nozzles and the glass substrate was set to 20 mm, and any offset in the spraying density was prevented by imparting a swing on the substrate side of ±150 mm in the x direction, and a swing on the nozzle side of ±150 mm in the Y direction. The time required to form the Ito film was 15 minutes.

Comparative Example 2

Figure 1:
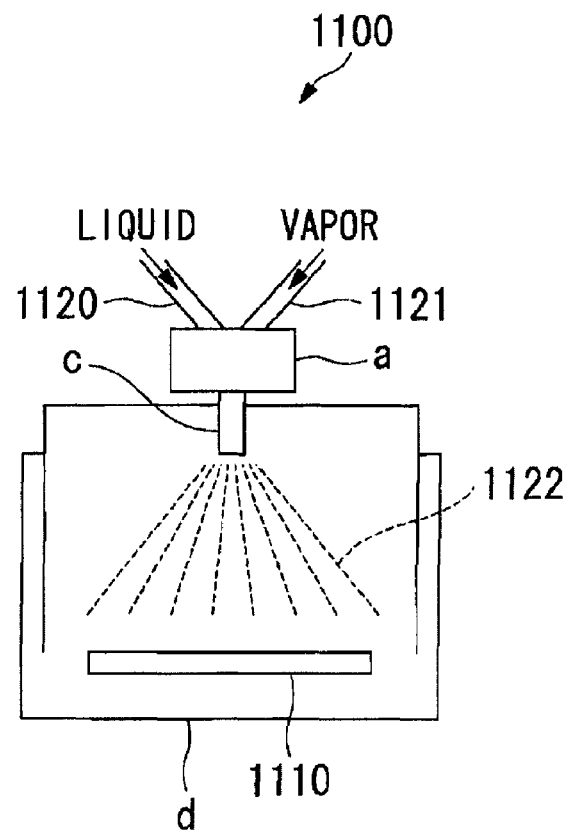
FIG. 1 is a schematic view showing the structure of a related art film forming apparatus.
Figure 2:
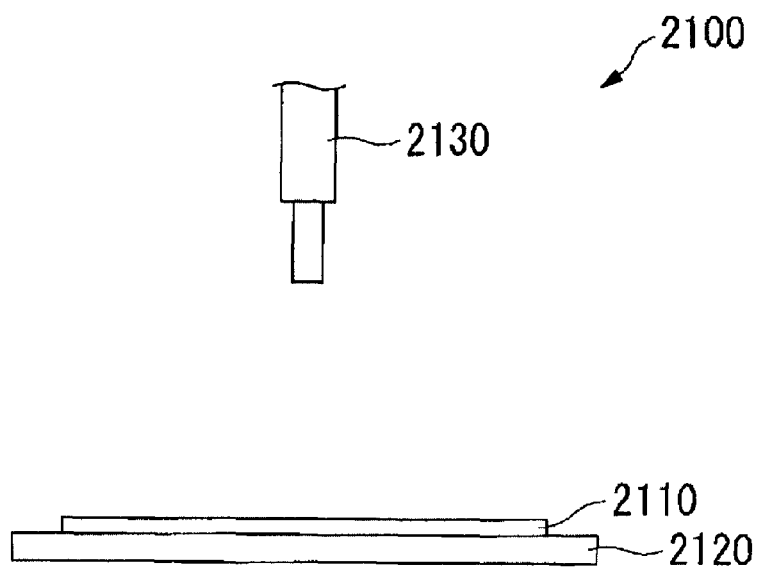
FIG. 2 is a view schematically showing an example of a related art film forming apparatus.
Figure 3A:
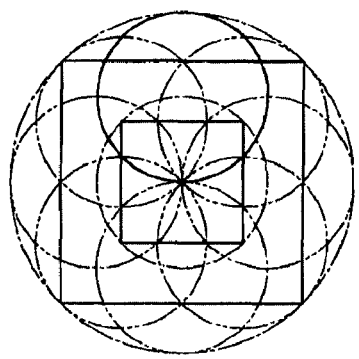
FIG. 3A is a view showing a nozzle driving pattern and a sprayed mist distribution.
Figure 3A:
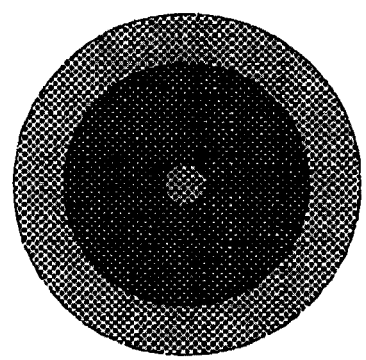
Figure 3A:
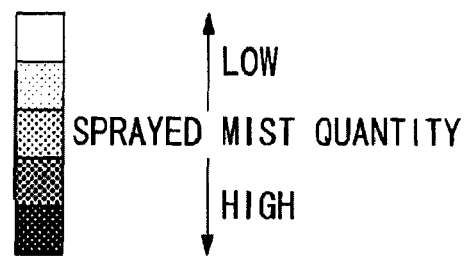
Figure 3B:
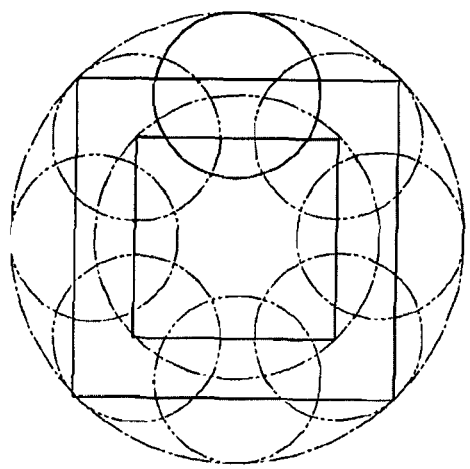
FIG. 3B is a view showing a nozzle driving pattern and a sprayed mist distribution.
Figure 3B:
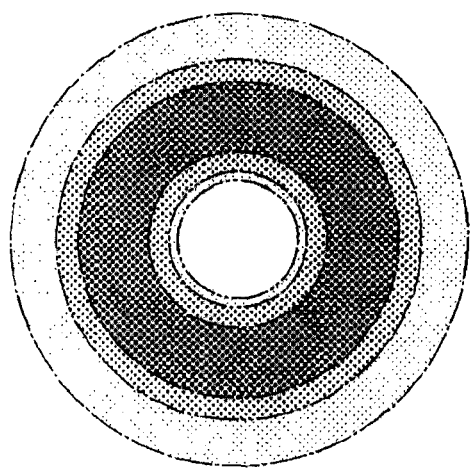
Figure 3B:
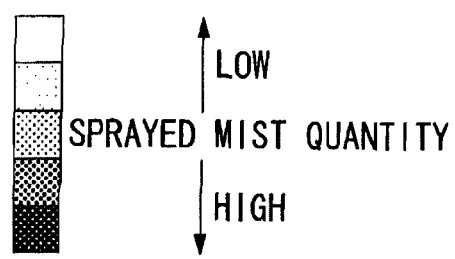
Figure 4A:
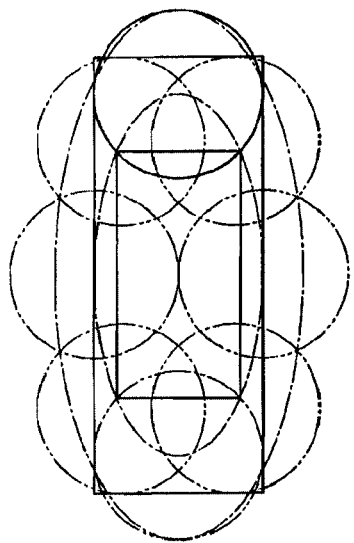
FIG. 4A is a view showing a nozzle driving pattern and a sprayed mist distribution.
Figure 4A:
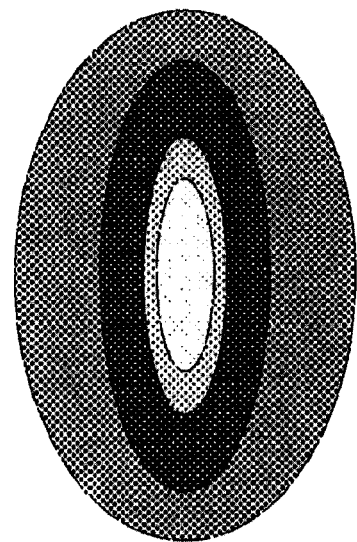
Figure 4A:
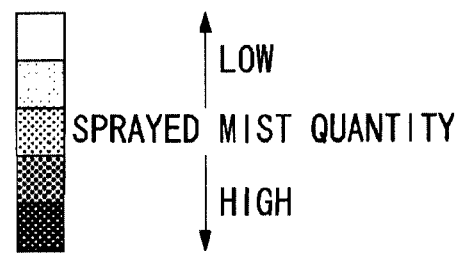
Figure 4B:
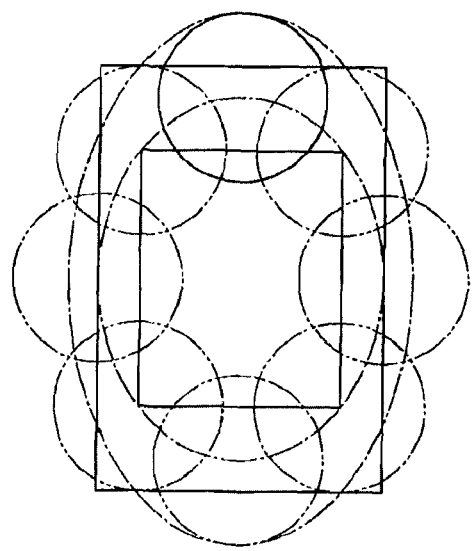
FIG. 4B is a view showing a nozzle driving pattern and a sprayed mist distribution.
Figure 4B:
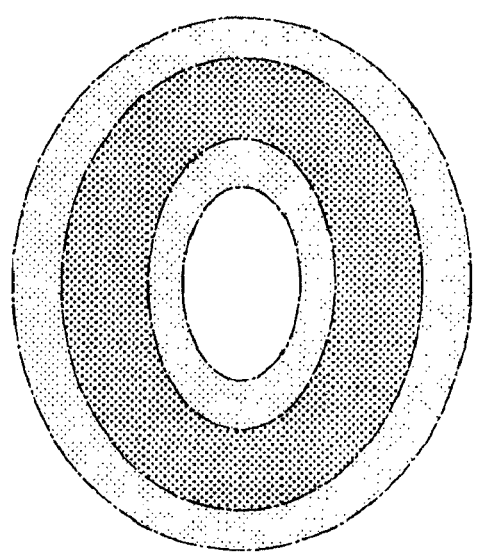
Figure 4B:
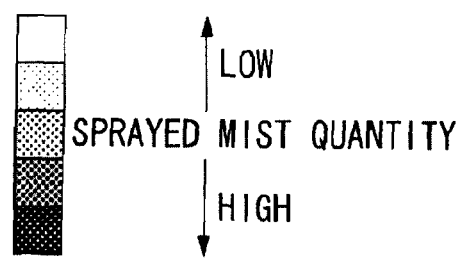

Using circular cylinder-shaped nozzles an ITO film was formed on a glass substrate in the same manner as in the examples other than the nozzles were driven elliptically as is shown in FIGS. 4A and 4B.

An ITO film was formed on a glass substrate in the above described manner.

A comparison of the characteristics of the substrates on which the ITO films were made in the example and the comparative example are shown in Table 7.

TABLE 7

| | Example 2-1 | Comparative Example 2 |
|---|---|---|
| Film thickness distribution [nm] | 750 to 850 | 700 to 900 |
| Sheet resistance distribution [$\Omega/cm^2$] | 3.2 to 3.9 | 2.6 to 4.4 |
| Transmissivity distribution [%] (overall light ray transmissivity) | 80 to 83 | 75 to 83 |

As evident from Table 7, in the example, the in-plane distribution of the sprayed mist quantity that was blown onto the substrate surface was made uniform. As a result, the film thickness and the thin film characteristics distribution were made uniform.

Examples 2-2 to 2-4

In Examples 2-2 to 2-4, a comparison was made based on difference in nozzle shape in slit type nozzles.

Other than the fact that nozzles having different shapes were used, ITO films were formed on glass substrates in the same manner as in Example 1. The three types of nozzle size and mist spray conditions that were used in Examples 2-2 to 2-4 are shown together in Table 8.

TABLE 8

| | Example 2-2 | Example 2-3 | Example 2-4 |
|---|---|---|---|
| Nozzle pipe inner diameter (D) [$\phi$cm] | | | |
| Nozzle discharge aperture size (X, Y) [mm] | 270 × 7 | 270 × 9 | 270 × 7 |
| Length of nozzle constricted portion (B) [mm] | 100 | 100 | 80 |
| Length of nozzle parallel portion (C) [mm] | 100 | 100 | 80 |
| Formula (2) relationship | Yes | No | Yes |
| Formula (3) relationship | Yes | Yes | No |
| Nozzle discharge aperture flow rate [cm/min] | 22500 | 17500 | 22500 |

The air flow rate distribution at the discharge aperture when air was supplied at 50,000 to 400,000 cm$^3$/minute to each nozzle was measured. The results thereof are shown in Table 9.

TABLE 9

| Air flow rate [cm³/min] | Flow rate distribution range [cm/min] | | |
|---|---|---|---|
| | Example 2-2 | Example 2-3 | Example 2-4 |
| 50,000 | ≦±5% | ≦±11% | ≦±12% |
| 100,000 | ≦±6% | ≦±10% | ≦±15% |
| 200,000 | ≦±3% | ≦±13% | ≦±16% |
| 40,000 | ≦±7% | ≦±12% | ≦±12% |
| 60,000 | ≦±6% | ≦±11% | ≦±11% |

As evident from Table 9, it can be understood that the nozzles in Example 2-2 that satisfy the relationships of both Formula 2 and Formula 3 have a small air flow rate distribution range and have excellent mist spray uniformity.

A comparison of the characteristics of the substrates on which the ITO films were formed in Examples 2-2 to 2-4 are shown in Table 10.

TABLE 10

| | Example 2-2 | Example 2-3 | Example 2-4 |
|---|---|---|---|
| Film thickness distribution [nm] | 750 to 850 | 710 to 880 | 700 to 850 |
| Sheet resistance distribution [Ω/cm²] | 3.2 to 3.9 | 2.8 to 4.2 | 2.6 to 4.3 |
| Transmissivity distribution [%] (overall light ray transmissivity) | 80 to 83 | 76 to 83 | 77 to 82 |

As evident from Table 10, in Example 2-2 in which nozzles that satisfy the relationships of both Formulae (1) and (2) were used, the distribution range of the sheet resistance was decreased and the transmissivity was improved. This is because the distribution range of the mist sprayed from the nozzle discharge apertures was decreased and the film thickness distribution was made uniform.

INDUSTRIAL APPLICABILITY

The present invention can be applied to film forming apparatuses that form a thin film such as a transparent conductive film or the like using spray pyrolysis deposition.

Although the above exemplary embodiments of the present invention have been described, it will be understood by those skilled in the art that the present invention should not be limited to the described exemplary embodiments, but that various changes and modifications can be made within the spirit and scope of the present invention. Accordingly, the scope of the present invention is not limited to the described range of the following claims.

The invention claimed is:

1. A film forming apparatus comprising:
 a device A that generates liquid fine particles having controlled particle diameters;
 a device B comprising a via for guiding the generated liquid fine particles while controlling a temperature thereof;
 a device C that sprays the guided liquid fine particles; and
 a device D comprising a space for forming a transparent conductive film by coating the sprayed liquid fine particles onto a subject to be processed;
 wherein in the device B, the via is isolated from the outside by a partitioning member and comprises a means for performing temperature control such that a temperature inside the via is kept at a higher temperature than the outside;
 wherein the device C comprises a spray nozzle having a mist intake side and a mist discharge side, and
 a face velocity at the mist intake side is $V_1$, a face velocity at the mist discharge side is $V_2$, and $V_2 > 1.5 V_1$.

2. The film forming apparatus according to claim 1, wherein, in the device B, the via is isolated from the outside by a partitioning member that has water repellency or has an internal surface that has undergone water repellency treatment.

3. The film forming apparatus according to claim 1, which forms a transparent conductive film by spray pyrolysis deposition method.

4. The film forming apparatus according to claim 1, wherein, in the device B, the partitioning member has a water repellency or has an interior wall that has undergone water repellency treatment, and a contact between the liquid fine particles and the interior wall that guides the liquid fine particles provides a contact angle of 80° or more.

5. The film forming apparatus according to claim 1, wherein the device B further comprises a coating film that imparts water repellency.

6. The film forming apparatus according to claim 1, wherein a mist generated in the device A that generates liquid fine particles contains between 60.0% by volume and 98.8% by volume of air.

7. The film forming apparatus according to claim 1, wherein the device B or interior walls of the device B are made of vinyl chloride resin or a fluororesin.

8. The film forming apparatus according to claim 1, wherein the device B comprises a bellows pipe.

9. The film forming apparatus according to claim 1, wherein the device C that sprays the guided liquid fine particles comprises a spray nozzle.

10. The film forming apparatus according to claim 1, wherein the subject to be processed in the device D is a glass substrate, the device D comprises at least one of a substrate heater located beneath the glass substrate and a heat ray heater located above the glass substrate, and the glass substrate is controlled to between 200° C. and 600° C.

11. The film forming apparatus according to claim 1, wherein the device C comprises a spray nozzle which sprays the guided liquid fine particles, and the spray nozzle and the subject to be processed in the device D are driven to form the transparent conductive film.

12. The film forming apparatus according to claim 1, wherein the device D comprises a supporting device on which the subject to be processed is mounted.

13. The film forming apparatus according to claim 1, wherein, a cross-sectional area of the mist intake side of the spray nozzle of the device C is $E_1$, a cross-sectional area of the mist discharge side of the spray nozzle of the device C is $E_2$, and $E_1 > 1.5 E_2$.

14. The film forming apparatus according to claim 1, wherein the mist discharge side of the spray nozzle of the device C has a slit shape.

15. The film forming apparatus according to claim 1, wherein the spray nozzle of the device C is shifted in a horizontal direction relative to a surface of the subject to be processed, and
 if the movement of the spray nozzle is a reciprocating movement, the nozzle is shifted in a direction away from the surface of the subject to be processed as the spray nozzle approaches a turn in which a horizontal movement of the spray nozzle changes direction.

16. The film forming apparatus according to claim 1, wherein the subject to be processed in the device D is a glass plate having a thickness of 0.3 mm to 5 mm.

* * * * *